US012557216B2

(12) United States Patent
Rajasekar et al.

(10) Patent No.: US 12,557,216 B2
(45) Date of Patent: Feb. 17, 2026

(54) TYPE-3 PRINTED CIRCUIT BOARDS (PCBS) WITH HYBRID LAYER COUNTS

(71) Applicant: Intel Corporation, Santa Clara, CA (US)

(72) Inventors: Arumanayagam Rajasekar, Bangaluru (IN); Tin Poay Chuah, Bayan Baru (MY); Sushil Padmanabhan, Thrissur (IN); Aiswarya M. Pious, Bangalore (IN); Navneet Kumar Singh, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 391 days.

(21) Appl. No.: 17/543,311

(22) Filed: Dec. 6, 2021

(65) Prior Publication Data

US 2022/0095456 A1    Mar. 24, 2022

(51) Int. Cl.
*H05K 1/14* (2006.01)
*H05K 1/02* (2006.01)
*H05K 1/11* (2006.01)

(52) U.S. Cl.
CPC ........... *H05K 1/115* (2013.01); *H05K 1/0298* (2013.01); *H05K 1/141* (2013.01); *H05K 1/144* (2013.01); *H05K 2201/041* (2013.01); *H05K 2201/09545* (2013.01); *H05K 2201/096* (2013.01)

(58) Field of Classification Search
CPC ...... H05K 1/115; H05K 1/0298; H05K 1/144; H05K 2201/09545; H05K 3/4611; H05K 3/4694; H05K 2201/09972; H05K 2201/10159; H05K 2203/061; H05K 3/429; H05K 2201/041; H05K 2201/096; H05K 1/141

See application file for complete search history.

(56) References Cited

U.S. PATENT DOCUMENTS

| 5,825,630 A | 10/1998 | Taylor et al. | |
| 6,992,899 B2 * | 1/2006 | Alger | H05K 1/141 257/691 |
| 8,254,144 B2 * | 8/2012 | Matsumoto | H05K 1/0224 361/600 |
| 9,958,897 B1 * | 5/2018 | Maroney | H05K 1/141 |

(Continued)

OTHER PUBLICATIONS

EP Extended European Search Report in EP Application Serial N. 22203437.3-1211 mailed on May 4, 2023 (7 pages).

*Primary Examiner* — Steven T Sawyer
(74) *Attorney, Agent, or Firm* — Alliance IP, LLC

(57) ABSTRACT

In one embodiment, a printed circuit board includes a first circuit board portion comprising a set of first conducting layers and one or more plated through hole (PTH) vias formed through the first conducting layers and a second circuit board portion comprising a set of second conducting layers. The second circuit board portion has an area less than an area of the first circuit board portion, and the second circuit board portion is coupled to the first circuit board portion via a laminate layer such that the first and second conducting layers are parallel with one another. The printed circuit board further includes one or more PTH vias formed through the first and second conducting layers in an area of the printed circuit board where the first and second circuit board portions overlap.

15 Claims, 10 Drawing Sheets

(56) References Cited

U.S. PATENT DOCUMENTS

| | | | |
|---|---|---|---|
| 2005/0270875 A1* | 12/2005 | Saeki | G11C 5/066 |
| | | | 365/222 |
| 2012/0147567 A1* | 6/2012 | Lee | H05K 1/181 |
| | | | 361/729 |
| 2013/0329393 A1* | 12/2013 | Wu | H05K 1/144 |
| | | | 361/803 |
| 2014/0133115 A1* | 5/2014 | Iguchi | H05K 1/0243 |
| | | | 361/760 |
| 2016/0165724 A1* | 6/2016 | Wells | G06F 1/16 |
| | | | 29/830 |
| 2017/0094791 A1* | 3/2017 | Enriquez Shibayama | |
| | | | H05K 1/141 |
| 2017/0181271 A1* | 6/2017 | Yee | H05K 1/0271 |
| 2017/0206937 A1* | 7/2017 | Chang | G06F 15/7807 |
| 2017/0290158 A1* | 10/2017 | Pihlman | H01L 23/49816 |
| 2018/0331081 A1* | 11/2018 | Goh | H01L 25/18 |
| 2020/0411495 A1* | 12/2020 | Hovis | G06F 1/183 |
| 2021/0120676 A1* | 4/2021 | Clavette | H05K 1/0262 |
| 2023/0043085 A1* | 2/2023 | Tay | H05K 1/119 |

\* cited by examiner

TYPE-3 PRINTED CIRCUIT BOARDS (PCBS) WITH HYBRID LAYER COUNTS

TECHNICAL FIELD

This disclosure relates in general to the field of computer systems and, more particularly, to Type-3 printed circuit boards (PCBs) with hybrid layer counts that include more layers in a core area of the PCB.

BACKGROUND

High speed signals traveling through plated through holes (PTHs) in a Type-3 printed circuit board (PCB) can encounter one or more issues related to via stubs. For example, signal reflections can occur along the vertical interconnect path that is not in series with the high-speed signal path will significantly degrade the signal integrity.

BRIEF DESCRIPTION OF THE DRAWINGS

Like reference numbers and designations in the various drawings indicate like elements.

DETAILED DESCRIPTION OF EXAMPLE EMBODIMENTS

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Figure 1:
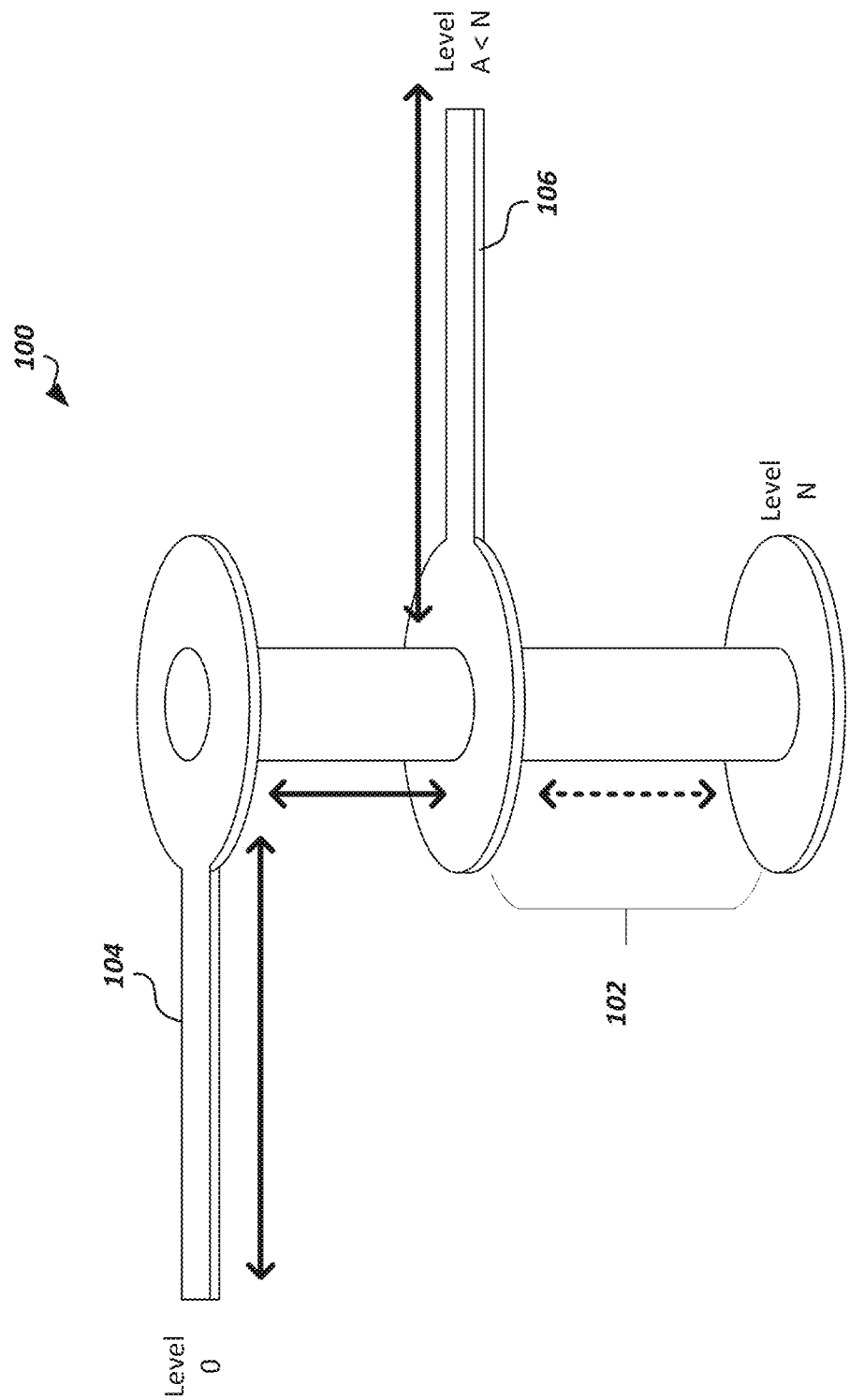
FIG. 1 illustrates an example plated through hole (PTH) via with a stub portion.

High speed signals traveling through plated through holes (PTHs) in a Type-3 printed circuit board (PCB) can encounter one or more issues related to via stubs. For example, signal reflections can occur along the vertical interconnect path that is not in series with the high-speed signal path will significantly degrade the signal integrity. For instance, referring to FIG. 1, which illustrates an example plated through hole (PTH) via 100 with a stub portion 102, an example signal may travel from the left side trace 104 on level 0 of the PCB, down the PTH 102, and out the right side trace 106 of the PCB on level A. However, the signal may also travel down the stub portion 102 and reflect back, causing unwanted effects. The longer the stub portion 102, the larger the impedance discontinuity, and consequently, insertion loss to the signal path.

Current PCB designs may have upwards of 16 total layers, with an overall thickness of approximately 1.6 mm, and these designs may be meant to fulfill customer 8-10 layer designs that are approximately 0.8-1 mm thick. That is, where a customer design calls for 8-10 layers, a PCB implementation may actually include upwards of 16 total layers, which will cause PTH stub portions that are approximately half the length of the overall PTH via. As input/output bus speeds increase (e.g., with memory speeds in LP5/x, DDR5, etc.), this discrepancy in via length will become a large loss issue. Furthermore, in some current designs, high-speed input/output (HSIO) traces may be routed on the bottom part of the PCBs to avoid stubs.

Thus, in embodiments of the present disclosure, PCBs may include a "core area" portion that includes more layers than areas of the PCB. The core area may refer to an area of the PCB in which important components of a computer system may be connected to the PCB, e.g., processors, memory devices/chips, input/output (IO) circuitry (e.g., IO controllers, such as PCIe controller hubs), power delivery circuitry, etc. The core area of the PCB may include a number or layers called for by a particular PCB design (e.g., 12 or 16), but the remaining areas of the PCB may include fewer layers (e.g., 6 or 8) than the core area.

In particular, the PCB may be manufactured in such a way that allows for shorter PTH vias in the core area of the PCB, which may reduce or eliminate some of the negative effects discussed above with respect to PTH stubs. For instance, in some embodiments, a sequential Type-3 (T3) PCB manufacturing process may be used to connect two (or more) separate sub-boards, where each sub-board includes a number of PTH vias. Once joined, longer PTH vias that go through all of the joined layers (i.e., those of all the sub-boards) may be inserted into the PCB as well to allow for signal routing through all layers. Accordingly, the resulting PCB may include shorter PTH vias in certain areas, reducing the size of or eliminating stub portions, while also having a reduced z-height in the non-core area of the board, which may allow for component placement on the PCB (or placement of other components inside a computer system (e.g., a laptop computer system)) where not possible before due to the extra layers in the non-core area. These techniques may allow for enjoying the lower costs associated with manufacturing T3 PCBs, without the need for T4 or other more expensive types of PCBs.

In PCB designs, not as many layers may be needed outside the core area of the PCB, as layer counts are primarily determined by the core area components and their and signal density (e.g., main system-on-chip (SoC), memory, power delivery, HSIO/LSIO breakout, etc.). For instance, the number signal breakouts from the main SoC can increase the layer count needed. Moreover, the board's core area size determines the density of the core area. The non-core area of the PCB may have fewer signal counts compared to core area routing density. For example, in some embodiments, a core area design may include 12 layers made up of 6 layers in each of two sub-boards. Thus, the core area may include shorter 6-layer PTH vias as well as 12-layer vias. The HSIO and/or low-speed IO (LSIO) signals can be routed using the shorter 6-layer PTH vias in the core area, while other signals (e.g., power delivery) may use the longer 12-layer PTH vias. The non-core areas may include only 6 layers, which may be sufficient for routing the lower density signals in those areas.

Figure 2A:
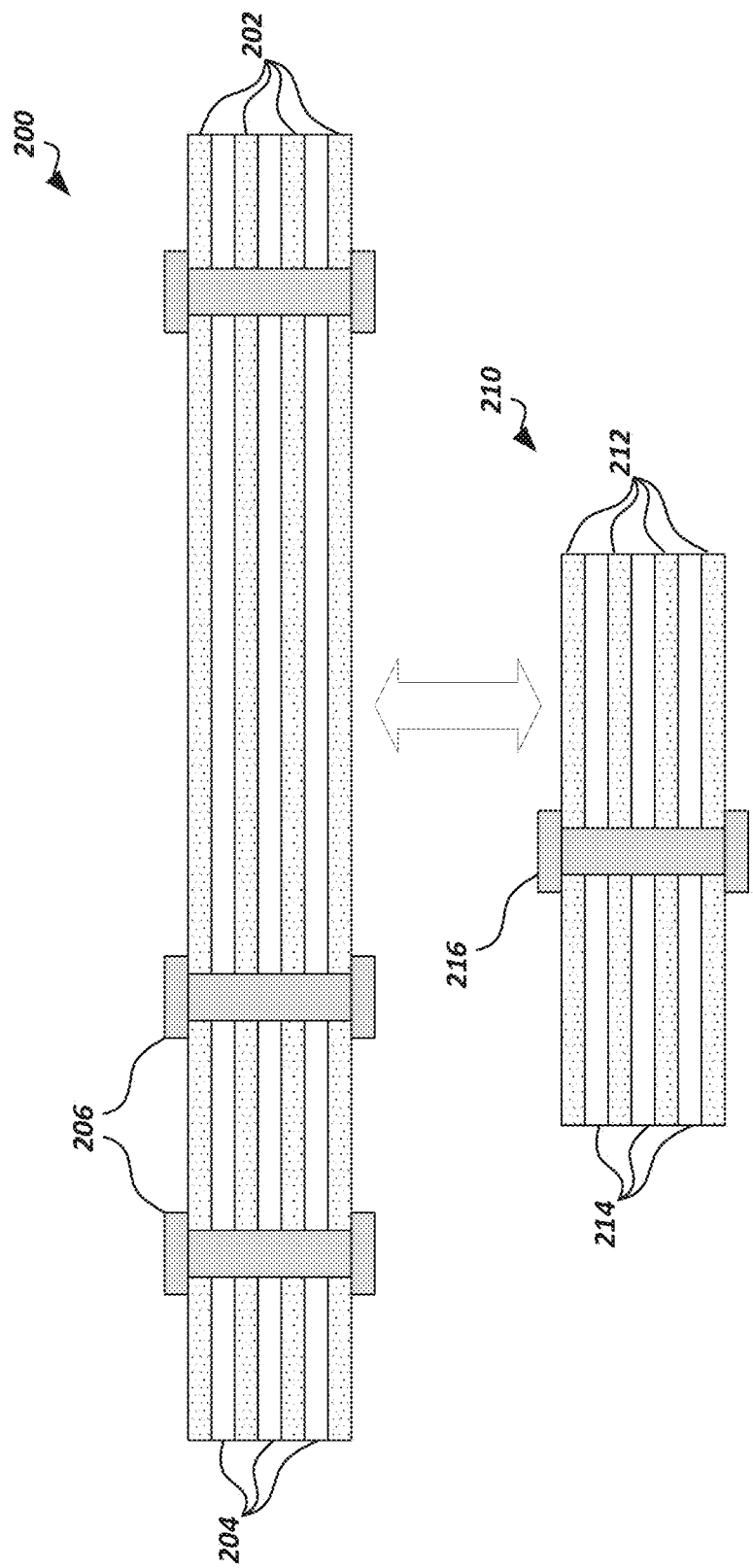
FIGS. 2A-2B illustrate an example sequential lamination process for joining two Type-3 printed circuit boards (PCBs) together in accordance with embodiments of the present disclosure.
Figure 2B:
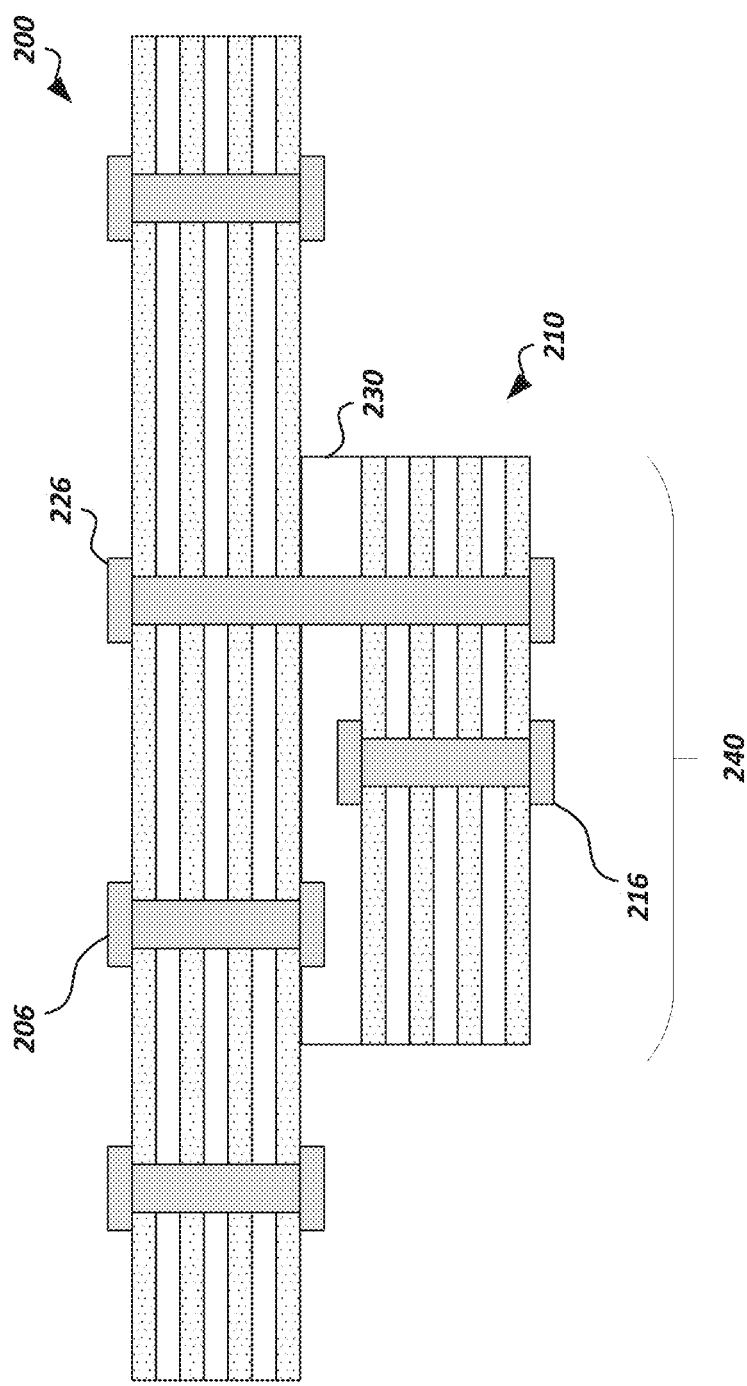

FIGS. 2A-2B illustrate an example sequential lamination process for joining two Type-3 (T3) printed circuit boards (PCBs) together in accordance with embodiments of the present disclosure. In the example shown, there are two sub-boards 200, 210, each of which includes metal layers 202, 212, and insulating lamination layers 204, 214 (e.g., prepreg or core layers). Each sub-board includes its own set of PTH vias 206, 216 formed therein. The two sub-boards 200, 210 may then be joined as shown in FIG. 2B with a lamination layer 230, forming a core area 240 in the resulting PCB that includes the total number of layers of the two sub-boards 200, 210 (the non-core areas still only include the number of layers of the sub-board 200). Additional PTH vias, e.g., 226, can then be formed in the core area 240 to allow for signal routing through all of the core-area layers.

Figure 3:
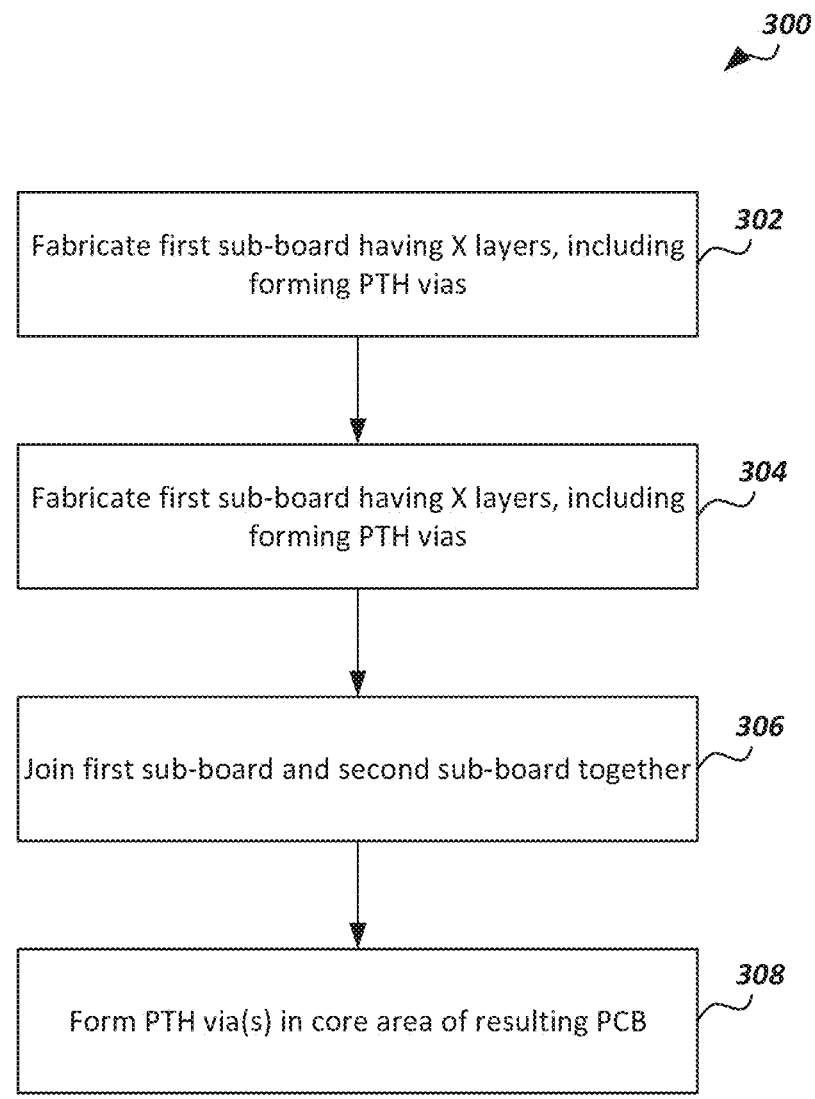
FIG. 3 illustrates a flow diagram of an example process of manufacturing PCBs with additional core-area layers in accordance with embodiments of the present disclosure.

FIG. 3 illustrates a flow diagram of an example process 300 of manufacturing PCBs with additional core-area layers in accordance with embodiments of the present disclosure. At 302, a first sub-board (e.g., 200) is fabricated, including forming PTH vias (e.g., 206) in the first sub-board. At 304, a second sub-board (e.g., 210) is fabricated, including forming PTH vias (e.g., 216) in the first sub-board. The first and second sub-boards may each be a Type-3 PCB, in certain embodiments. At 306, the two sub-boards are joined together, e.g., using a sequential Type-3 PCB lamination process. This may include aligning the sub-boards as desired, and then joining them together using a lamination layer between the boards. At 308, one or more additional PTH vias (e.g., 226) are formed in the core-area (e.g., 240) of the resulting PCB.

Figure 4:
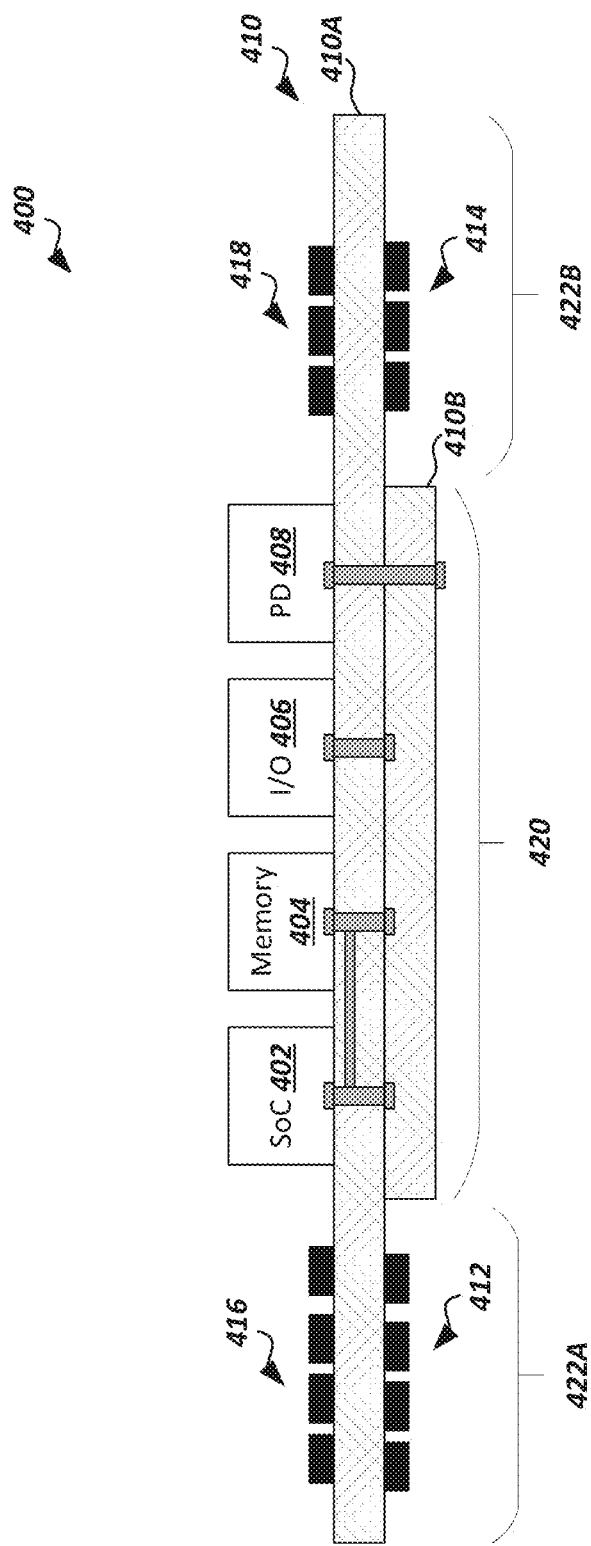
FIG. 4 illustrates an example system incorporating a PCB with additional core-area layers in accordance with embodiments of the present disclosure.

FIG. 4 illustrates an example system 400 incorporating a PCB with additional core-area layers in accordance with embodiments of the present disclosure. The example system 400 includes a number of components attached to a PCB 410 that includes two sub-boards 410A, 410B, which form a core area 420. The PCB may be formed in a similar manner as described above. As shown, the example system 400 includes "core" components of a computer system, e.g., a main SoC 402, memory 404, IO circuitry 406, and power delivery circuitry 408, connected to the PCB 410 in the core area 420. As described above and shown in FIG. 4, certain routing (e.g., HSIO routing between the SoC 402 and memory 404) may utilize the shorter PTH vias in the core area 420 provided in the sub-board 410, while other routing (e.g., power delivery routing) can utilize longer PTH vias in the core area 420.

The HSIO routing (which may include routing for, e.g., Thunderbolt (TBT), Peripheral Component Interconnect Express (PCIe), Universal Serial Bus (USB) v4 over Type-C, or USB Type-A connections) may benefit from improved electrical characteristics enabled by the reduced size of the shorter PTH vias in the core area, as described above. For example, in a conventional 12-layer PCB stack-up, these types of interfaces would have used layer 11-layer 12 or layer 11-layer 10 routing to avoid the stub issues. However, with embodiments of the present disclosure, such routing can between layers 4, 5, or 6 (e.g., for TBT, or Type-C routing) in the 12-layer core area, or between any of the layers 1-6 in the 12-layer core area (e.g., for Type-A or PCIe routing).

The system 400 also includes a number of components 412, 414, 416, 418 in the non-core areas 422 of the PCB 410. These may include power sockets (e.g., DC power connectors), IO connectors (e.g., USB, TBT, etc.) for peripheral devices, audio connectors (e.g., 3.5 mm audio out jacks), video connectors (e.g., HDMI or eDP ports), or the like. As shown, due to the reduced layer count in the non-core areas of the PCB 410, certain components (e.g., 412, 414) may be placed on the secondary side (e.g., bottom side in FIG. 4) of the PCB 410 to take advantage of the extra z-area now available. Going "dual-sided" in this manner can help in PCB miniaturization. In addition, the extra z-area now available can provide thermal benefits as well, allowing more of an air gap in the overall stack and helping to increase air flow inside the system 400, which can help lower the skin temperature of the PCB 410 or the components connected to the PCB 410 and hence, provide higher system performance.

Figure 5:
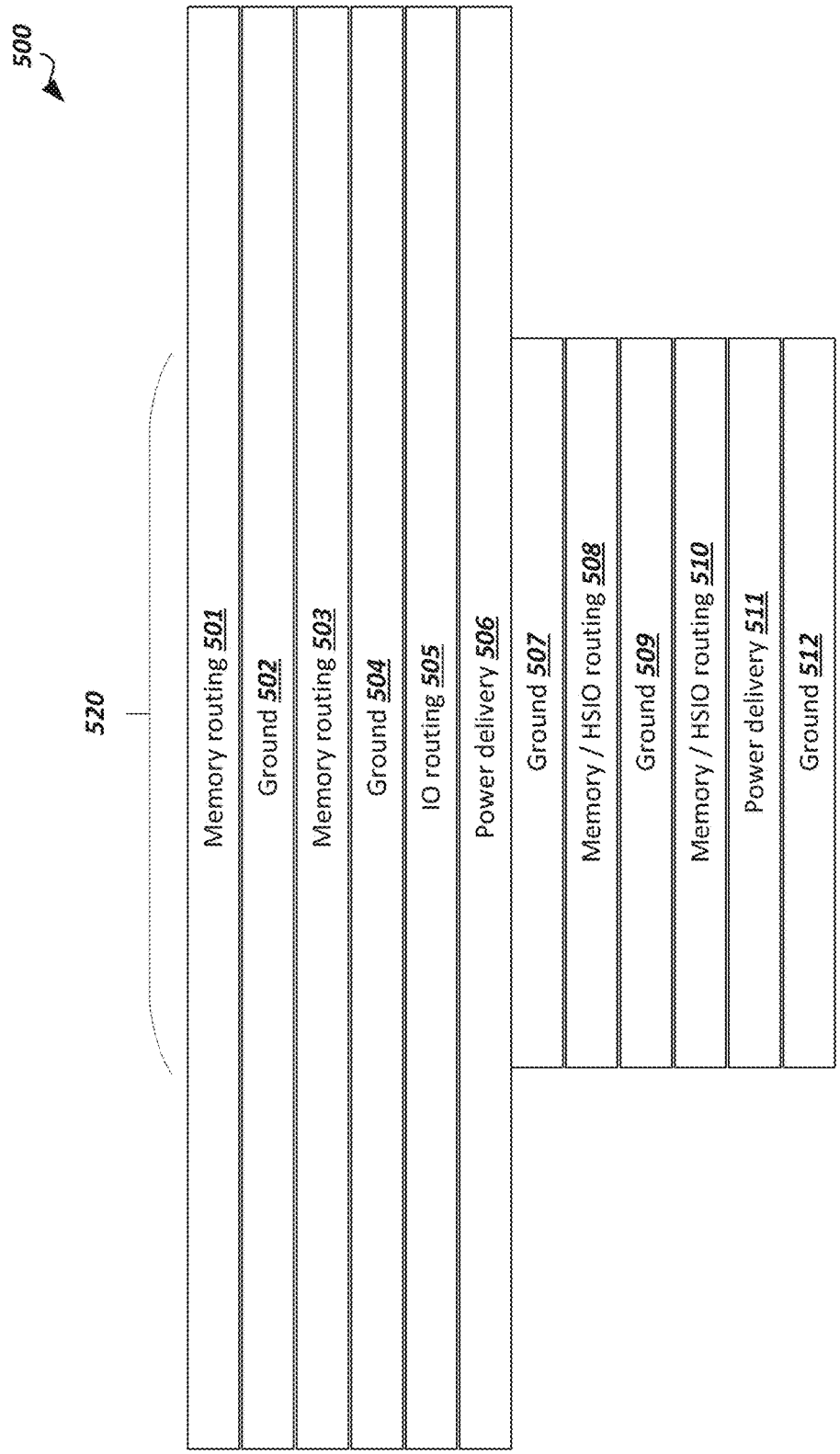
FIG. 5 illustrates an example stack-up for an example PCB with additional core area layers in accordance with embodiments of the present disclosure.

FIG. 5 illustrates an example stack-up for an example PCB 500 with additional core area layers in accordance with embodiments of the present disclosure. In the example shown, the PCB 500 includes a layer 501 with memory signal routing (e.g., GDDR6 CAC signals), a ground layer 502, a layer 503 with additional memory signal routing (e.g., GDDR6 DQ and/or CLK signals), another ground layer 504, a layer 505 with IO signal routing (e.g., HSIO or other IO routing), and a layer 506 with power delivery routing. In addition to layers 501-506, which span the entirety of the PCB 500, there are additional layers inside the core area 520 of the PCB 500 (which is similar to the core area 420 of FIG. 4). In the example shown, the additional layers include another ground layer 507, a layer 508 with additional memory signal and/or IO signal routing, another ground layer 509, another layer 510 with additional memory signal and/or IO signal routing, another power delivery layer 511, and another ground layer 512.

Figure 6A:
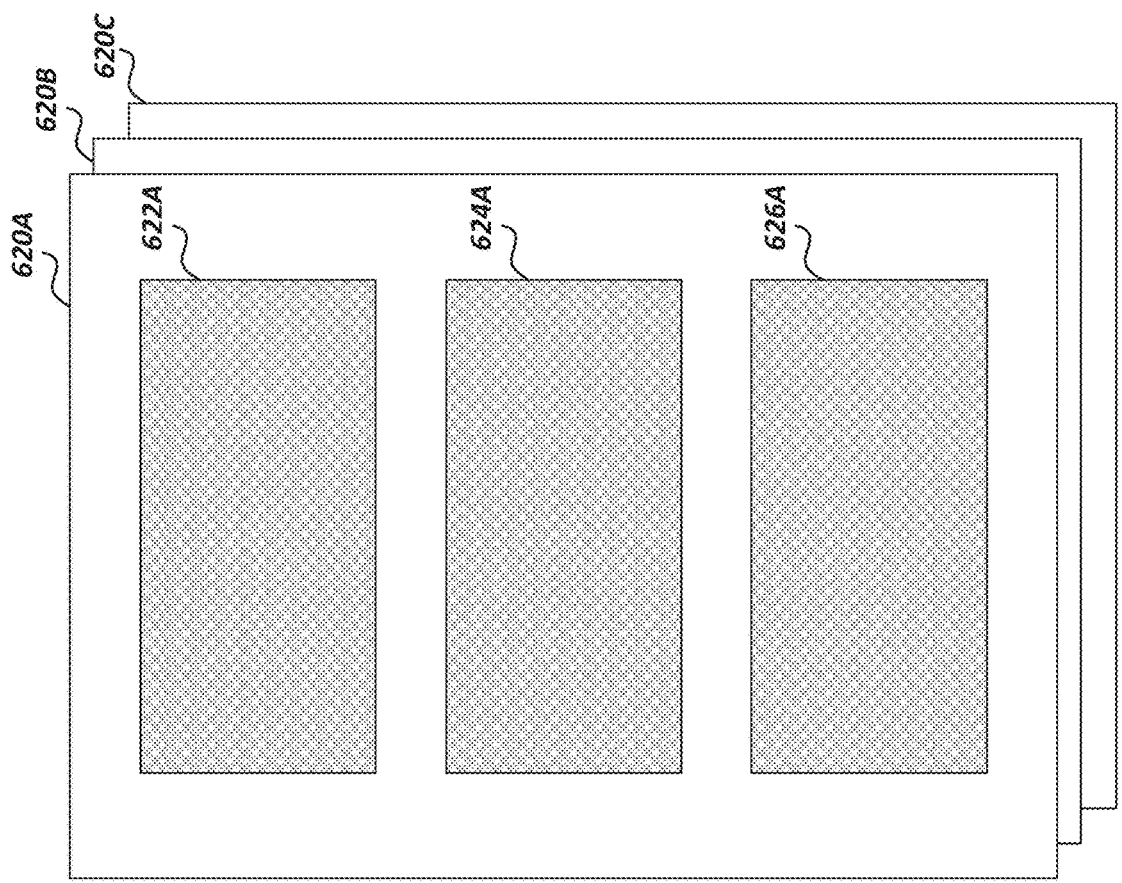
FIGS. 6A-6B illustrate an example manufacturing technique for PCBs with additional core area layers in accordance with embodiments of the present disclosure.
Figure 6A:
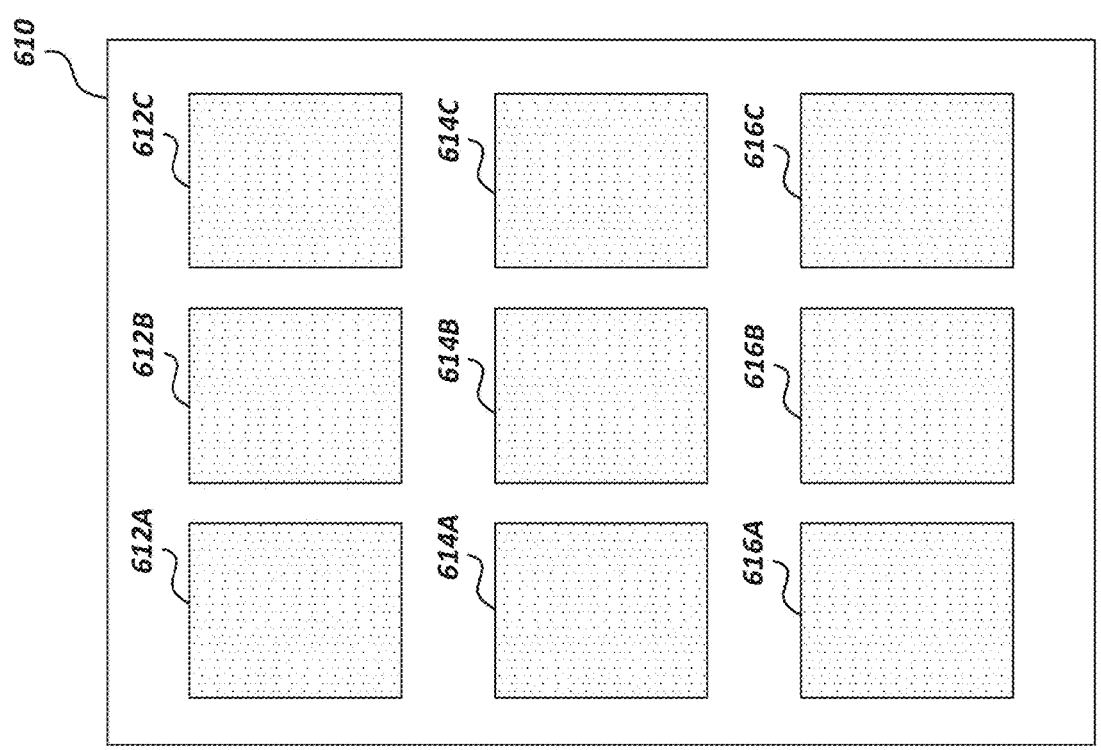
Figure 6B:
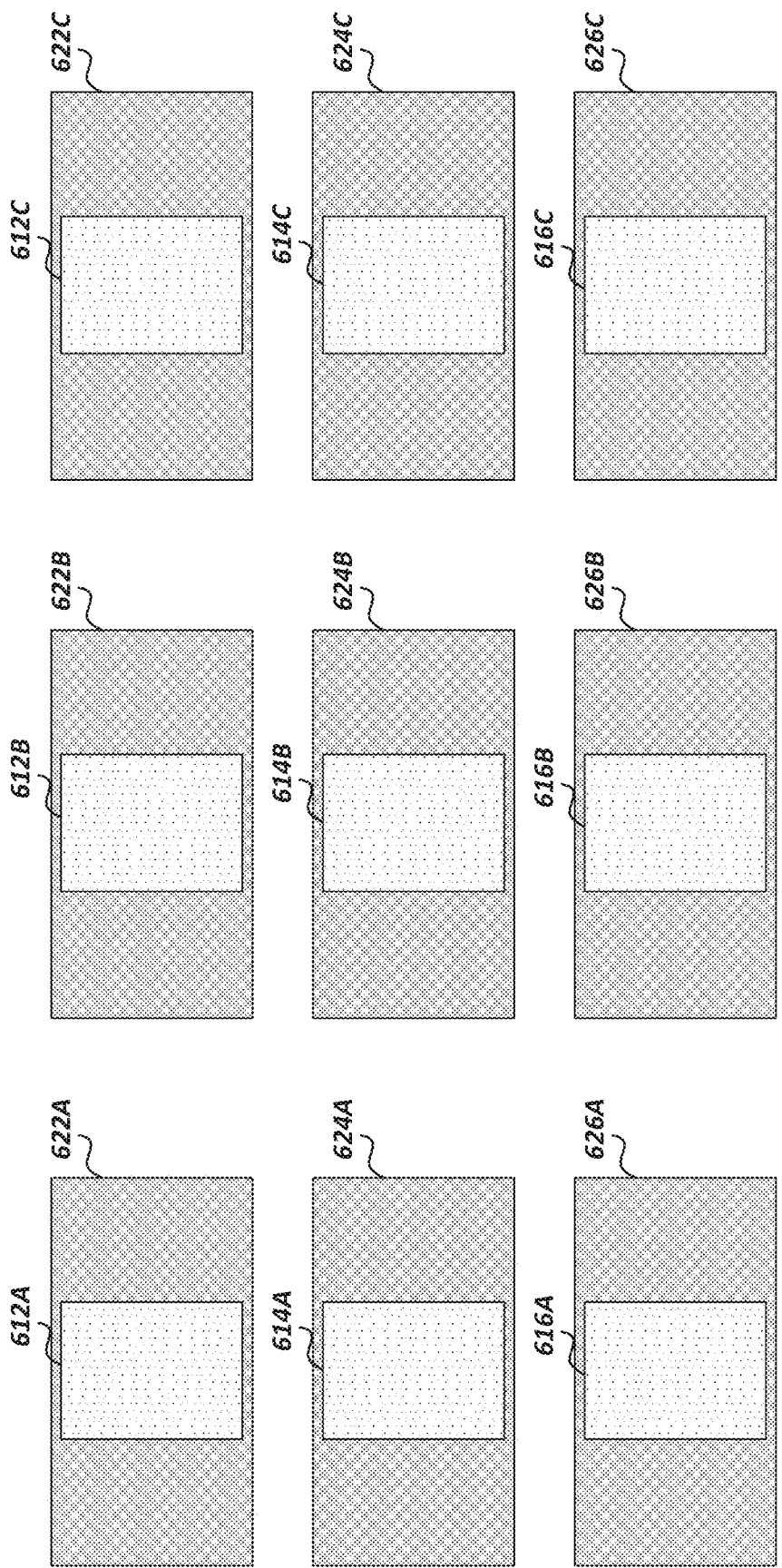

FIGS. 6A-6B illustrate an example manufacturing technique for PCBs with additional core area layers in accordance with embodiments of the present disclosure. In the example shown in FIG. 6A, a set of 9 sub-boards 612, 614, 616 are formed on a first PCB panel 610. The sub-boards 612, 614, 616 may be implemented similar to the sub-board 210 of FIGS. 2A-2B. In addition, a set of 3 sub-boards 622, 624, 626 are formed on each of three different PCB panels 620. The sub-boards 622, 624, 626 may be implemented similar to the sub-board 200 of FIGS. 2A-2B. Subsets of 3 sub-boards from the panel 610 (e.g., 612A, 614A, 616A of the panel 610) are then joined to each sub-board of a panel 620 (e.g., 622A, 624A, 626A of the panel 620A) as shown in FIG. 6B. In this example, 3× more sub-boards can be produced on the panel 610, which is the same size as panel 620, leading to a potential total full stack of material cost saving of >30%. In addition, the total cost of manufacturing the 9 overall PCBs as shown in FIG. 6B may be only approximately 1.3× the cost of manufacturing a conventional PCB with a full layer stack all around, which is still less than the cost of moving up to a more expensive type of PCB manufacturing (e.g., Type-4 PCB, which is typically approximately 1.6× more expensive than Type-3 PCB manufacturing).

Figure 7:
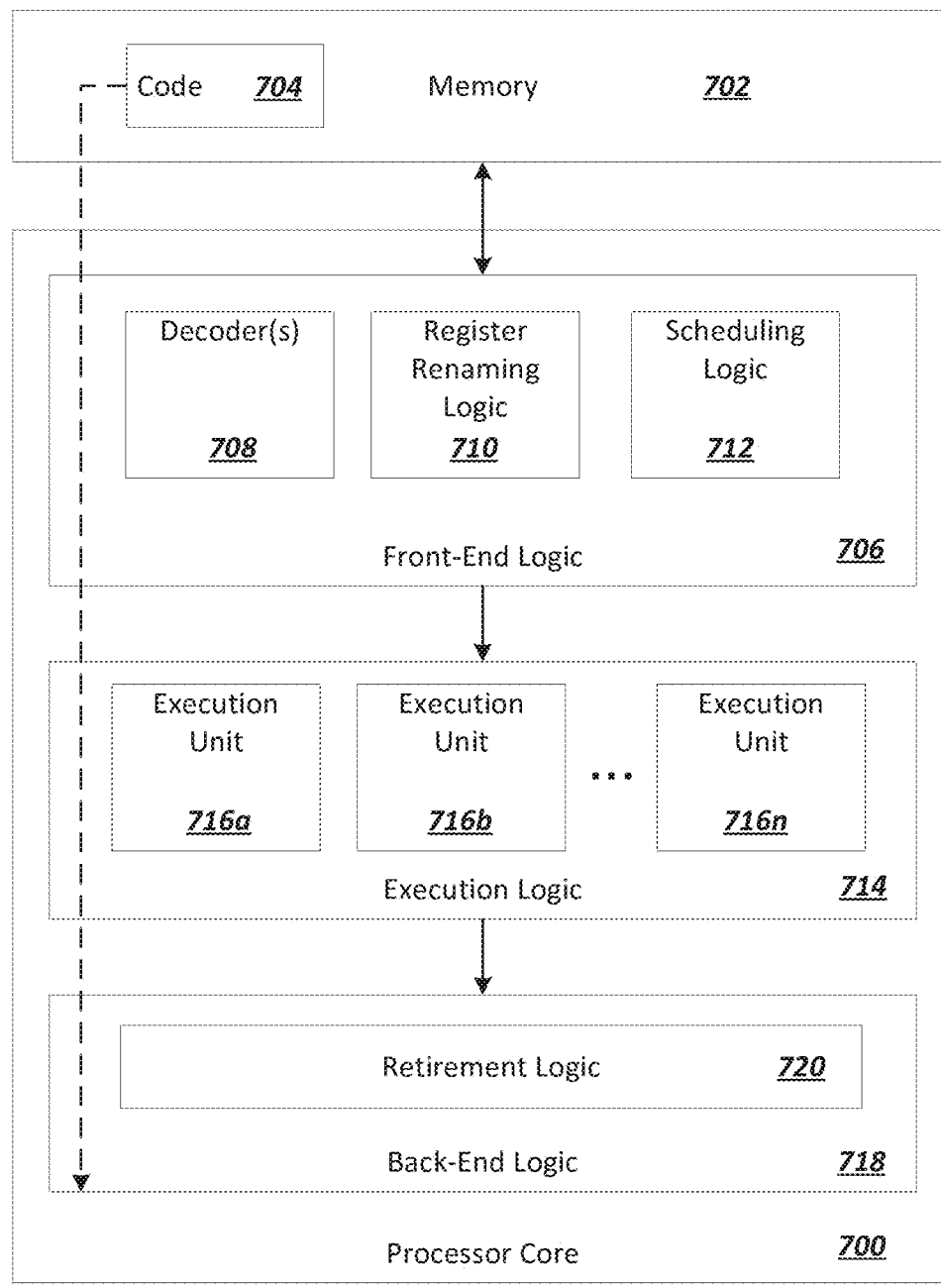
FIG. 7 is an example illustration of a processor according to an embodiment.
Figure 8:
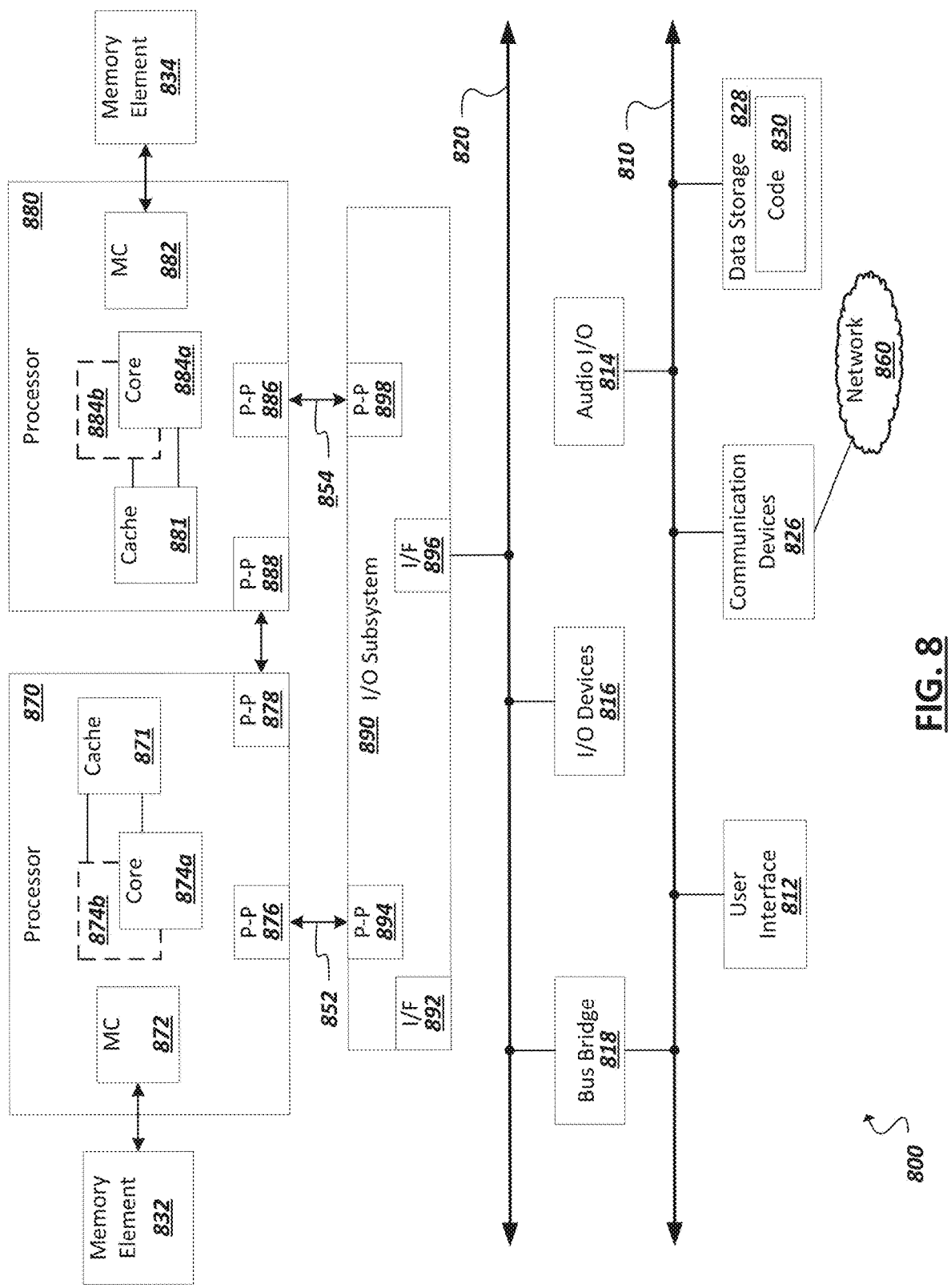
FIG. 8 illustrates a computing system that is arranged in a point-to-point (PtP) configuration according to an embodiment.

FIGS. 7-8 are block diagrams of example computer architectures that may be used in accordance with embodiments disclosed herein. For example, in some embodiments, a computer system (e.g., the system 400 of FIG. 4) may contain one or more aspects shown in FIGS. 7-8. Other computer architecture designs known in the art for processors and computing systems may also be used. Generally, suitable computer architectures for embodiments disclosed herein can include, but are not limited to, configurations illustrated in FIGS. 7-8.

FIG. 7 is an example illustration of a processor according to an embodiment. Processor 700 is an example of a type of hardware device that can be used in connection with the implementations above. Processor 700 may be any type of processor, such as a microprocessor, an embedded processor, a digital signal processor (DSP), a network processor, a multi-core processor, a single core processor, or other device to execute code. Although only one processor 700 is illustrated in FIG. 7, a processing element may alternatively include more than one of processor 700 illustrated in FIG. 7. Processor 700 may be a single-threaded core or, for at least one embodiment, the processor 700 may be multi-threaded in that it may include more than one hardware thread context (or "logical processor") per core.

FIG. 7 also illustrates a memory 702 coupled to processor 700 in accordance with an embodiment. Memory 702 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 700 can execute any type of instructions associated with algorithms, processes, or operations detailed herein. Generally, processor 700 can transform an element or an article (e.g., data) from one state or thing to another state or thing.

Code 704, which may be one or more instructions to be executed by processor 700, may be stored in memory 702, or may be stored in software, hardware, firmware, or any suitable combination thereof, or in any other internal or external component, device, element, or object where appropriate and based on particular needs. In one example, processor 700 can follow a program sequence of instructions indicated by code 704. Each instruction enters a front-end logic 706 and is processed by one or more decoders 708. The decoder may generate, as its output, a micro operation such as a fixed width micro operation in a predefined format, or may generate other instructions, microinstructions, or control signals that reflect the original code instruction. Front-end logic 706 also includes register renaming logic 710 and scheduling logic 712, which generally allocate resources and queue the operation corresponding to the instruction for execution.

Processor 700 can also include execution logic 714 having a set of execution units 716*a*, 716*b*, 716*n*, etc. Some embodiments may include a number of execution units dedicated to specific functions or sets of functions. Other embodiments may include only one execution unit or one execution unit that can perform a particular function. Execution logic 714 performs the operations specified by code instructions.

After completion of execution of the operations specified by the code instructions, back-end logic 718 can retire the instructions of code 704. In one embodiment, processor 700 allows out of order execution but requires in order retirement of instructions. Retirement logic 720 may take a variety of known forms (e.g., re-order buffers or the like). In this manner, processor 700 is transformed during execution of code 704, at least in terms of the output generated by the decoder, hardware registers and tables utilized by register renaming logic 710, and any registers (not shown) modified by execution logic 714.

Although not shown in FIG. 7, a processing element may include other elements on a chip with processor 700. For example, a processing element may include memory control logic along with processor 700. The processing element may include I/O control logic and/or may include I/O control logic integrated with memory control logic. The processing element may also include one or more caches. In some embodiments, non-volatile memory (such as flash memory or fuses) may also be included on the chip with processor 700.

FIG. 8 illustrates a computing system 800 that is arranged in a point-to-point (PtP) configuration according to an embodiment. In particular, FIG. 8 shows a system where processors, memory, and input/output devices are interconnected by a number of point-to-point interfaces. Generally, one or more of the computing systems described herein may be configured in the same or similar manner as computing system 800.

Processors 870 and 880 may also each include integrated memory controller logic (MC) 872 and 882 to communicate with memory elements 832 and 834. In alternative embodiments, memory controller logic 872 and 882 may be discrete logic separate from processors 870 and 880. Memory elements 832 and/or 834 may store various data to be used by processors 870 and 880 in achieving operations and functionality outlined herein.

Processors 870 and 880 may be any type of processor, such as those discussed in connection with other figures. Processors 870 and 880 may exchange data via a point-to-point (PtP) interface 850 using point-to-point interface circuits 878 and 888, respectively. Processors 870 and 880 may each exchange data with a chipset 890 via individual point-to-point interfaces 852 and 854 using point-to-point interface circuits 876, 886, 894, and 898. Chipset 890 may also exchange data with a co-processor 838, such as a high-performance graphics circuit, machine learning accelerator, or other co-processor 838, via an interface 839, which could be a PtP interface circuit. In alternative embodiments, any or all of the PtP links illustrated in FIG. 8 could be implemented as a multi-drop bus rather than a PtP link.

Chipset 890 may be in communication with a bus 820 via an interface circuit 896. Bus 820 may have one or more devices that communicate over it, such as a bus bridge 818 and I/O devices 816. Via a bus 810, bus bridge 818 may be in communication with other devices such as a user interface 812 (such as a keyboard, mouse, touchscreen, or other input devices), communication devices 826 (such as modems, network interface devices, or other types of communication devices that may communicate through a computer network 860), audio I/O devices 816, and/or a data storage device 828. Data storage device 828 may store code 830, which may be executed by processors 870 and/or 880. In alternative embodiments, any portions of the bus architectures could be implemented with one or more PtP links.

The computer system depicted in FIG. 8 is a schematic illustration of an embodiment of a computing system that may be utilized to implement various embodiments discussed herein. It will be appreciated that various components of the system depicted in FIG. 8 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any embodiments or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes a printed circuit board comprising: a first circuit board portion comprising a set of first conducting layers and one or more plated through hole (PTH) vias formed through the first conducting layers; a second circuit board portion comprising a set of second conducting layers, wherein an area of the second circuit board portion is less than an area of the first circuit board portion and the second circuit board portion is coupled to the first circuit board portion via a laminate layer such that the first and second conducting layers are parallel with one another; and one or more PTH vias formed through the first and second conducting layers in an area of the printed circuit board where the first and second circuit board portions overlap.

Example 2 includes the subject matter of Example 1, wherein the second circuit board portion further comprises one or more PTH vias formed through the second conducting layers.

Example 3 includes the subject matter of Example 1, wherein the second circuit board portion is coupled to the first circuit board portion via a first surface of the first circuit board portion, and the printed circuit board further comprises a set of electrical components coupled to the first circuit board portion on the first surface of the first circuit board portion.

Example 4 includes the subject matter of Example 3, wherein the set of electrical components coupled to the first circuit board portion on the first surface of the first circuit board portion are a first set of electrical components, and the printed circuit board further comprises a second set of electrical components coupled to the first circuit board portion on a second surface of the first circuit board portion opposite the first surface.

Example 5 includes the subject matter of Example 3 or 4, wherein the electrical components include one or more of a socket to receive electrical power, an audio connector, a video connector, and an input/output (IO) connector.

Example 6 includes the subject matter of any one of Examples 1-5, further comprising a socket to receive a device comprising a processor, the socket coupled to the first circuit board portion and connected to one or more of the PTH vias formed through the first conducting layers.

Example 7 includes the subject matter of Example 6, wherein the socket is further connected to one or more of the PTH vias formed through the first and second conducting layers.

Example 8 includes the subject matter of any one of Examples 1-7, further comprising a socket to receive a memory device, the socket coupled to the first circuit board portion and connected to one or more of the PTH vias formed through the first conducting layers.

Example 9 includes the subject matter of Example 8, wherein the socket is further connected to one or more of the PTH vias formed through the first and second conducting layers.

Example 10 includes the subject matter of any one of Examples 1-9, further comprising input/output (IO) circuitry coupled to one or more of the PTH vias formed through the first conducting layers.

Example 11 includes the subject matter of Example 10, wherein the IO circuitry is further connected to one or more of the PTH vias formed through the first and second conducting layers.

Example 12 includes the subject matter of any one of Examples 1-11, further comprising power delivery circuitry coupled to one or more of the PTH vias formed through the first and second conducting layers.

Example 13 is a system comprising: a printed circuit board (PCB) comprising: a first circuit board portion comprising a set of first conducting layers and one or more plated through hole (PTH) vias formed through the first conducting layers; a second circuit board portion comprising a set of second conducting layers, wherein an area of the second circuit board portion is less than an area of the first circuit board portion and the second circuit board portion is coupled to the first circuit board portion via a laminate layer such that the first and second conducting layers are parallel with one another; and one or more PTH vias formed through the first and second conducting layers in an area of the printed circuit board where the first and second circuit board portions overlap; and a system-on-chip (SoC) coupled to the PCB in an area of the PCB where the first and second circuit board portions overlap.

Example 14 includes the subject matter of Example 13, further comprising memory coupled to the PCB in the area of the PCB where the first and second circuit board portions overlap, wherein the SoC and the memory are connected through one or more of the PTH vias formed through the first conducting layers.

Example 15 includes the subject matter of Example 14, further comprising input/output (IO) circuitry to couple the SoC and the memory.

Example 16 includes the subject matter of Example 14 or 15, wherein the SoC and the memory are further connected through one or more of the PTH vias formed through the first and second conducting layers.

Example 17 includes the subject matter of any one of Examples 13-16, wherein the second circuit board portion further comprises one or more PTH vias formed through the second conducting layers.

Example 18 includes the subject matter of any one of Examples 13-17, wherein the second circuit board portion is coupled to the first circuit board portion via a first surface of the first circuit board portion, and the printed circuit board further comprises a set of electrical components coupled to the first circuit board portion on the first surface of the first circuit board portion.

Example 19 includes the subject matter of Example 18, wherein the set of electrical components coupled to the first circuit board portion on the first surface of the first circuit board portion are a first set of electrical components, and the printed circuit board further comprises a second set of electrical components coupled to the first circuit board portion on a second surface of the first circuit board portion opposite the first surface.

Example 20 includes the subject matter of Example 18 or 19, wherein the electrical components include one or more of a socket to receive electrical power, an audio connector, a video connector, and an input/output (IO) connector.

Example 21 is a method of fabricating a printed circuit board comprising: forming a first printed circuit board (PCB) portion comprising a set of first conducting layers; forming a set of plated through hole (PTH) vias through the first PCB portion; forming a second PCB portion comprising a set of second conducting layers; coupling the first PCB portion and the second PCB portion using a laminate; and forming a set of PTH vias through the first and second PCB portions.

Example 22 includes the subject matter of Example 21, further comprising forming a set of PTH vias through the second PCB portion before coupling the first and second PCB portions.

Example 23 includes the subject matter of Example 21 or 22, further comprising coupling a set of electrical components to the first PCB portion on a surface of the first PCB portion that is coupled to the second PCB portion.

Example 24 includes the subject matter of Example 23, further comprising coupling a set of electrical components to the first PCB portion on a surface of the first PCB portion opposite the surface that is coupled to the second PCB portion.

Example 25 includes the subject matter of Example 23 or 24, wherein the electrical components include one or more of a socket to receive electrical power, an audio connector, a video connector, and an input/output (IO) connector.

Example 26 includes the subject matter of any one of Examples 21-25, further comprising coupling a socket to receive a device comprising a processor to the first circuit board portion such that the socket is connected to one or more of the PTH vias formed through the first PCB portion.

Example 27 includes the subject matter of any one of Examples 21-26, further comprising coupling a socket to receive a memory device to the first circuit board portion such that the socket is connected to one or more of the PTH vias formed through the first PCB portion.

Example 28 includes the subject matter of any one of Examples 21-27, further comprising coupling input/output (IO) circuitry to one or more of the PTH vias formed through the first PCB portion.

Example 29 includes the subject matter of any one of Examples 21-28, further comprising coupling power delivery circuitry to one or more of the PTH vias formed through the first and second PCB portion.

Example 30 is a product formed by the process of any one of Examples 21-29.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A printed circuit board comprising: a first circuit board portion comprising a set of first conducting layers and one or more plated through hole (PTH) vias formed through the first conducting layers; a second circuit board portion comprising a set of second conducting layers, wherein an area of the second circuit board portion is less than an area of the first circuit board portion and the second circuit board portion is coupled to the first circuit board portion via a laminate layer such that the first and second conducting layers are parallel with one another wherein the second circuit board portion is coupled to a first surface of the first circuit board portion; one or more PTH vias formed through the first and second conducting layers in an area of the printed circuit board where the first and second circuit board portions overlap; and power delivery circuitry coupled to a second surface of the first circuit board portion opposite the first surface, the power delivery circuitry connected to one or more of the PTH vias formed through the first and second conducting layers; input/output (IO) circuitry coupled to one or more of the PTH vias formed through the first conducting layers: and a socket to receive a device comprising a processor, the socket coupled to the first circuit board portion and connected to one or more of the PTH vias formed through the first conducting layers.

2. The printed circuit board of claim 1, wherein the second circuit board portion further comprises one or more PTH vias formed through the second conducting layers.

3. The printed circuit board of claim 1, wherein the printed circuit board further comprises a set of electrical components coupled to the first circuit board portion on the first surface of the first circuit board portion.

4. The printed circuit board of claim 3, wherein the set of electrical components coupled to the first circuit board portion on the first surface of the first circuit board portion are a first set of electrical components, and the printed circuit board further comprises a second set of electrical components coupled to the first circuit board portion on the second surface of the first circuit board portion opposite the first surface.

5. The printed circuit board of claim 3, wherein the electrical components include one or more of a socket to receive electrical power, an audio connector, a video connector, and an input/output (IO) connector.

6. The printed circuit board of claim 1, wherein the socket is further connected to one or more of the PTH vias formed through the first and second conducting layers.

7. The printed circuit board of claim 1, further comprising a socket to receive a memory device, the socket coupled to the first circuit board portion and connected to one or more of the PTH vias formed through the first conducting layers.

8. The printed circuit board of claim 7, wherein the socket is further connected to one or more of the PTH vias formed through the first and second conducting layers.

9. The printed circuit board of claim 1, wherein the IO circuitry is further connected to one or more of the PTH vias formed through the first and second conducting layers.

10. A system comprising:
a printed circuit board (PCB) comprising:
    a first circuit board portion comprising a set of first conducting layers and one or more plated through hole (PTH) vias formed through the first conducting layers;
    a second circuit board portion comprising a set of second conducting layers, wherein an area of the second circuit board portion is less than an area of the first circuit board portion and the second circuit board portion is coupled to the first circuit board portion via a laminate layer such that the first and second conducting layers are parallel with one another; and
    one or more PTH vias formed through the first and second conducting layers in an area of the printed circuit board where the first and second circuit board portions overlap;
a system-on-chip (SoC) coupled to the PCB in an area of the PCB where the first and second circuit board portions overlap, the SoC coupled to a side of the first circuit board portion opposite the second circuit board portion;
memory coupled to the PCB in the area of the PCB where the first and second circuit board portions overlap;
input/output (IO) circuitry to couple the SoC and the memory through one or more of the PTH vias formed through the first conducting layers; and
power delivery circuitry coupled to the PCB and connected to one or more of the PTH vias formed through the first and second conducting layers.

11. The system of claim 10, wherein the SoC and the memory are further connected through one or more of the PTH vias formed through the first and second conducting layers.

12. The system of claim 10, wherein the second circuit board portion further comprises one or more PTH vias formed through the second conducting layers.

13. The system of claim 10, wherein the second circuit board portion is coupled to the first circuit board portion via a first surface of the first circuit board portion, and the printed circuit board further comprises a set of electrical components coupled to the first circuit board portion on the first surface of the first circuit board portion.

14. The system of claim 13, wherein the set of electrical components coupled to the first circuit board portion on the first surface of the first circuit board portion are a first set of electrical components, and the printed circuit board further comprises a second set of electrical components coupled to the first circuit board portion on a second surface of the first circuit board portion opposite the first surface.

15. The system of claim 13, wherein the electrical components include one or more of a socket to receive electrical power, an audio connector, a video connector, and an input/output (IO) connector.

* * * * *